US011346912B2

(12) United States Patent
Guidon et al.

(10) Patent No.: US 11,346,912 B2
(45) Date of Patent: May 31, 2022

(54) SYSTEMS AND METHODS OF GENERATING ROBUST PHASE IMAGES IN MAGNETIC RESONANCE IMAGES

(71) Applicant: GE PRECISION HEALTHCARE LLC, Wauwatosa, WI (US)

(72) Inventors: Arnaud Guidon, Somerville, MA (US); Xinzeng Wang, Houston, TX (US); Daniel Vance Litwiller, Denver, CO (US); Tim Sprenger, Munich (DE); Robert Marc Lebel, Calgary (CA); Ersin Bayram, Houston, TX (US)

(73) Assignee: GE Precision Healthcare LLC, Wauwatosa, WI (US)

( * ) Notice: Subject to any disclaimer, the term of this patent is extended or adjusted under 35 U.S.C. 154(b) by 0 days.

(21) Appl. No.: 16/937,324

(22) Filed: Jul. 23, 2020

(65) Prior Publication Data

US 2022/0026516 A1 Jan. 27, 2022

(51) Int. Cl.
*G01R 33/565* (2006.01)
*G01R 33/56* (2006.01)
(Continued)

(52) U.S. Cl.
CPC ... *G01R 33/56545* (2013.01); *G01R 33/4828* (2013.01); *G01R 33/5608* (2013.01);
(Continued)

(58) Field of Classification Search
CPC .......... G01R 33/56545; G01R 33/5608; G01R 33/4804; G01R 33/56341; G01R 33/56316; G01R 33/4828
See application file for complete search history.

(56) References Cited

U.S. PATENT DOCUMENTS 7,227,359 B2 6/2007 Ma
10,043,243 B2 8/2018 Matviychuk et al.
(Continued)

OTHER PUBLICATIONS

Prah et al., A Simple method for Rectified Noise Floor Suppression [. . . ] Magnetic Resonance in Medicine, 2010; 64 (2): pp. 418-429.
Eichner et al. Real Diffusion-Weighted MRI Enabling True Signal Averaging and Increased Diffusion Contrast, Nov. 15, 2015. NeuroImage 122, pp. 373-384.
(Continued)

*Primary Examiner* — Susan S Lee

(57) ABSTRACT

A computer-implemented method of correcting phase and reducing noise in magnetic resonance (MR) phase images is provided. The method includes executing a neural network model for analyzing MR images, wherein the neural network model is trained with a pair of pristine images and corrupted images, wherein the corrupted images include corrupted phase information, the pristine images are the corrupted images with the corrupted phase information reduced, and target output images of the neural network model are the pristine images. The method further includes receiving MR images including corrupted phase information, and analyzing the received MR images using the neural network model. The method also includes deriving pristine phase images of the received MR images based on the analysis, wherein the derived pristine phase images include reduced corrupted phase information, compared to the received MR images, and outputting MR images based on the derived pristine phase images.

20 Claims, 11 Drawing Sheets

(51) Int. Cl.
   *G01R 33/48* (2006.01)
   *G01R 33/563* (2006.01)

(52) U.S. Cl.
   CPC . *G01R 33/56316* (2013.01); *G01R 33/56341* (2013.01); *G01R 33/4804* (2013.01)

(56) References Cited

U.S. PATENT DOCUMENTS

| | | | |
|---|---|---|---|
| 10,096,109 B1 | 10/2018 | Zaharchuk et al. | |
| 10,482,378 B1 | 11/2019 | Hu et al. | |
| 10,607,138 B2 | 3/2020 | Hu et al. | |
| 2017/0108570 A1 | 4/2017 | Eichner et al. | |
| 2020/0126190 A1 | 4/2020 | Lebel | |
| 2021/0123999 A1* | 4/2021 | An | G01R 33/56509 |
| 2021/0134028 A1* | 5/2021 | Cai | G01R 33/5602 |
| 2021/0181287 A1* | 6/2021 | Sommer | G01R 33/5608 |

OTHER PUBLICATIONS

Sprenger et al. Real Valued Diffusion-weighted Imaging Using Decorrelated Phase Filtering, Feb. 22, 2016. Magnetic Resonance in Medicine 77, pp. 559-570.

Tisdall, et al. Using Human and Model Performance to Compare MRI Reconstructions, Oct. 30, 2006. IEEE Transactions on Medical Imaging 25, pp. 1510-1517.

Jifara et al. Medical Image Denoising Using Convolutional Neural Network: A Residual Learning Approach, Jun. 2017, The Journal of Supercomputing 76(6): 1-15.

Lee et al. Deep Residual Learning for Accelerated MRI using Magnitude and Phase Networks, Apr. 2, 2018, IEEE Transactions on Biomedical Engineering, 11 pages.

Ichinoseki et al. Noise Power Spectrum in Propeller MR Imaging, Mar. 31, 2015. Magnetic Resonance in Medicine 14, pp. 235-242.

* cited by examiner

US 11,346,912 B2

SYSTEMS AND METHODS OF GENERATING ROBUST PHASE IMAGES IN MAGNETIC RESONANCE IMAGES

BACKGROUND

The field of the disclosure relates generally to systems and methods of correcting phase and reducing noise in phase images, and more particularly, to systems and methods of correcting phase and reducing noise in phase images in medical images using a neural network model.

Magnetic resonance imaging (MRI) has proven useful in diagnosis of many diseases. MRI provides detailed images of soft tissues, abnormal tissues such as tumors, and other structures, which cannot be readily imaged by other imaging modalities, such as computed tomography (CT). Further, MRI operates without exposing patients to ionizing radiation experienced in modalities such as CT and x-rays.

Further, compared to other imaging modalities, MRI is unique in that an MRI signal is represented by a complex number, rather than a scalar or a real number. The image value for each image pixel, therefore, includes a magnitude and a phase. The phase of an MR image is often discarded, although it carries important information and may be used in many applications, especially in applications for estimating parameters that cannot be estimated with only the magnitude. The magnitude operation also changes the noise distribution and affects the image quality and estimation of parameters using MR images.

BRIEF DESCRIPTION

In one aspect, a computer-implemented method of correcting phase and reducing noise in magnetic resonance (MR) phase images is provided. The method includes executing a neural network model for analyzing MR images, wherein the neural network model is trained with a pair of pristine images and corrupted images, wherein the corrupted images include corrupted phase information, the pristine images are the corrupted images with the corrupted phase information reduced, and target output images of the neural network model are the pristine images. The method further includes receiving MR images including corrupted phase information, and analyzing the received MR images using the neural network model. The method also includes deriving pristine phase images of the received MR images based on the analysis, wherein the derived pristine phase images include reduced corrupted phase information, compared to the received MR images, and outputting MR images based on the derived pristine phase images.

In another aspect, a phase image correction and noise reduction system, including a phase image correction and noise reduction computing device, the phase image correction and noise reduction computing device including at least one processor in communication with at least one memory device. The at least one processor is programmed to execute a neural network model for analyzing MR images, wherein the neural network model is trained with a pair of pristine images and corrupted images, wherein the corrupted images include corrupted phase information, the pristine images are the corrupted images with the corrupted phase information reduced, and target output images of the neural network model are the pristine images. The at least one processor is also programmed to receive MR images including corrupted phase information, and analyze the received MR images using the neural network model. The at least one processor is further programmed to derive pristine phase images of the received MR images based on the analysis, wherein the pristine phase images include reduced corrupted phase information, compared to the received MR images and output MR images based on the pristine phase images.

DRAWINGS

DETAILED DESCRIPTION

The disclosure includes systems and methods of correcting and reducing noise in magnetic resonance (MR) phase images of an object. As used herein, corrupted phase information includes noise, undesired artifacts, background phase, or any combination thereof. Undesired artifacts may be caused by eddy currents, physiological noise, $B_0$ drifts, or other system imperfections. A corrupted image is an image includes corrupted phase information. A pristine image is an image with corrupted phase information reduced. Denoising includes reducing or removing corrupted phase information, and may include correcting phase and/or reducing or removing noise in phase images. Method aspects will be in part apparent and in part explicitly discussed in the following description.

In magnetic resonance imaging (MRI), a subject is placed in a magnet. When the subject is in the magnetic field generated by the magnet, magnetic moments of nuclei, such as protons, attempt to align with the magnetic field but precess about the magnetic field in a random order at the nuclei's Larmor frequency. The magnetic field of the magnet is referred to as B0 and extends in the longitudinal or z direction. In acquiring an MRI image, a magnetic field (referred to as an excitation field B1), which is in the x-y plane and near the Larmor frequency, is generated by a radio-frequency (RF) coil and may be used to rotate, or "tip," the net magnetic moment Mz of the nuclei from the z direction to the transverse or x-y plane. A signal, which is referred to as an MR signal, is emitted by the nuclei, after the excitation signal B1 is terminated. To use the MR signals to generate an image of a subject, magnetic field gradient pulses (Gx, Gy, and Gz) are used. The gradient pulses are used to scan through the k-space, the space of spatial frequencies or inverse of distances. A Fourier relationship exists between the acquired MR signals and an image of the subject, and therefore the image of the subject can be derived by reconstructing the MR signals.

Figure 1:
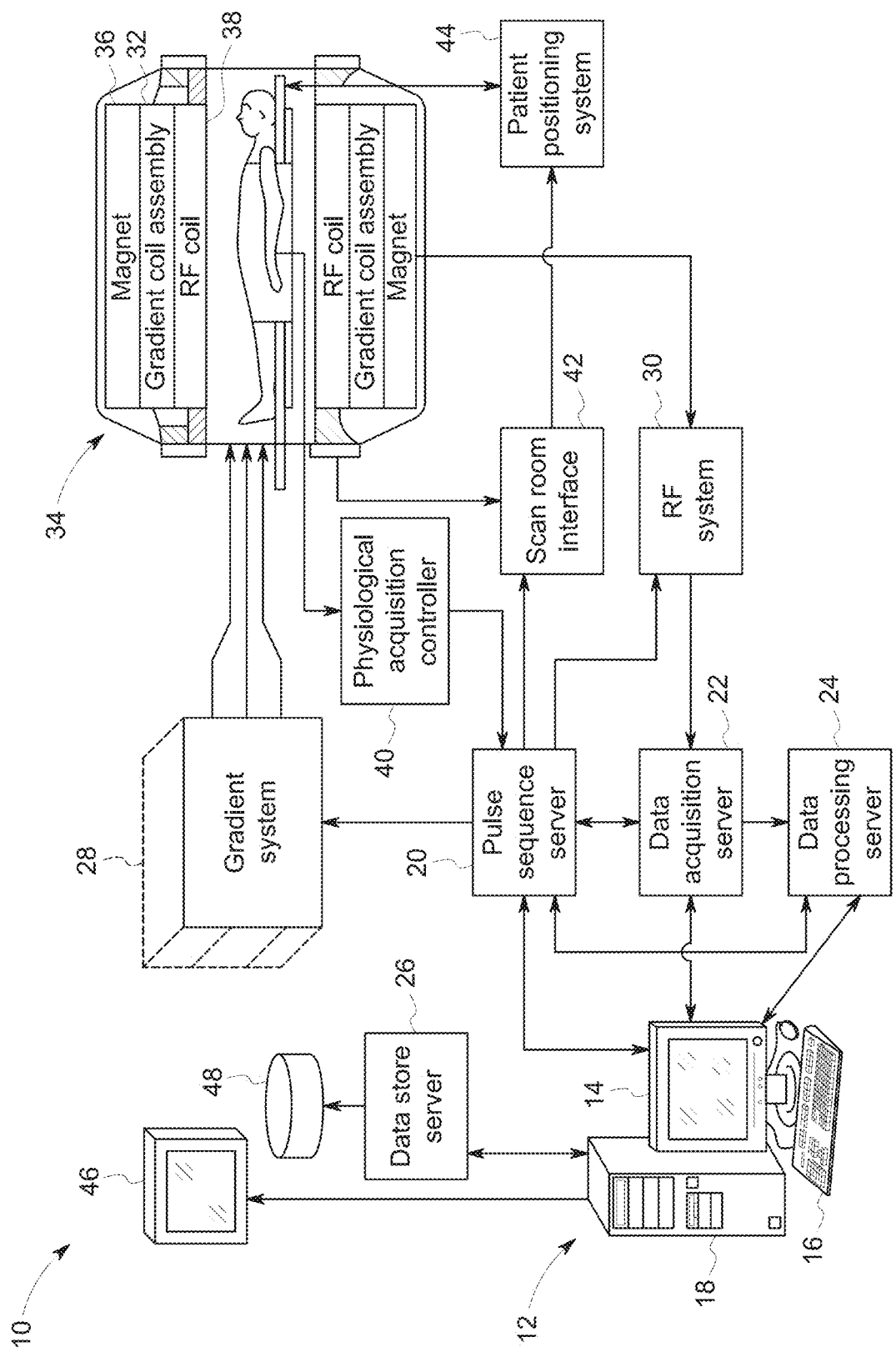
FIG. 1 is a schematic diagram of an exemplary magnetic resonance imaging (MRI) system.

FIG. 1 illustrates a schematic diagram of an exemplary MRI system 10. In the exemplary embodiment, the MRI system 10 includes a workstation 12 having a display 14 and a keyboard 16. The workstation 12 includes a processor 18, such as a commercially available programmable machine running a commercially available operating system. The workstation 12 provides an operator interface that allows scan prescriptions to be entered into the MRI system 10. The workstation 12 is coupled to a pulse sequence server 20, a data acquisition server 22, a data processing server 24, and a data store server 26. The workstation 12 and each server 20, 22, 24, and 26 communicate with each other.

In the exemplary embodiment, the pulse sequence server 20 responds to instructions downloaded from the workstation 12 to operate a gradient system 28 and a radiofrequency ("RF") system 30. The instructions are used to produce gradient and RF waveforms in MR pulse sequences. An RF coil 38 and a gradient coil assembly 32 are used to perform the prescribed MR pulse sequence. The RF coil 38 is shown as a whole body RF coil. The RF coil 38 may also be a local coil that may be placed in proximity to the anatomy to be imaged, or a coil array that includes a plurality of coils.

In the exemplary embodiment, gradient waveforms used to perform the prescribed scan are produced and applied to the gradient system 28, which excites gradient coils in the gradient coil assembly 32 to produce the magnetic field gradients $G_x$, $G_y$, and $G_z$ used for position-encoding MR signals. The gradient coil assembly 32 forms part of a magnet assembly 34 that also includes a polarizing magnet 36 and the RF coil 38.

In the exemplary embodiment, the RF system 30 includes an RF transmitter for producing RF pulses used in MR pulse sequences. The RF transmitter is responsive to the scan prescription and direction from the pulse sequence server 20 to produce RF pulses of a desired frequency, phase, and pulse amplitude waveform. The generated RF pulses may be applied to the RF coil 38 by the RF system 30. Responsive MR signals detected by the RF coil 38 are received by the RF system 30, amplified, demodulated, filtered, and digitized under direction of commands produced by the pulse sequence server 20. The RF coil 38 is described as a transmitter and receiver coil such that the RF coil 38 transmits RF pulses and detects MR signals. In one embodiment, the MRI system 10 may include a transmitter RF coil that transmits RF pulses and a separate receiver coil that detects MR signals. A transmission channel of the RF system 30 may be connected to a RF transmission coil and a receiver channel may be connected to a separate RF receiver coil. Often, the transmission channel is connected to the whole body RF coil 38 and each receiver section is connected to a separate local RF coil.

In the exemplary embodiment, the RF system 30 also includes one or more RF receiver channels. Each RF receiver channel includes an RF amplifier that amplifies the MR signal received by the RF coil 38 to which the channel is connected, and a detector that detects and digitizes the I and Q quadrature components of the received MR signal. The magnitude of the received MR signal may then be determined as the square root of the sum of the squares of the I and Q components as in Eq. (1) below:

$$M = \sqrt{I^2 + Q^2} \qquad (1)$$

and the phase of the received MR signal may also be determined as in Eq. (2) below:

$$\varphi = \tan^{-1}\left(\frac{Q}{I}\right). \qquad (2)$$

In the exemplary embodiment, the digitized MR signal samples produced by the RF system 30 are received by the data acquisition server 22. The data acquisition server 22 may operate in response to instructions downloaded from the workstation 12 to receive real-time MR data and provide buffer storage such that no data is lost by data overrun. In some scans, the data acquisition server 22 does little more than pass the acquired MR data to the data processing server 24. In scans that need information derived from acquired MR data to control further performance of the scan, however, the data acquisition server 22 is programmed to produce the needed information and convey it to the pulse sequence server 20. For example, during prescans, MR data is acquired and used to calibrate the pulse sequence performed by the pulse sequence server 20. Also, navigator signals may be acquired during a scan and used to adjust the operating parameters of the RF system 30 or the gradient system 28, or to control the view order in which k-space is sampled.

In the exemplary embodiment, the data processing server 24 receives MR data from the data acquisition server 22 and processes it in accordance with instructions downloaded from the workstation 12. Such processing may include, for example, Fourier transformation of raw k-space MR data to produce two or three-dimensional images, the application of filters to a reconstructed image, the performance of a back-projection image reconstruction of acquired MR data, the generation of functional MR images, and the calculation of motion or flow images.

In the exemplary embodiment, images reconstructed by the data processing server 24 are conveyed back to, and stored at, the workstation 12. In some embodiments, real-time images are stored in a database memory cache (not shown in FIG. 1), from which they may be output to operator display 14 or a display 46 that is located near the magnet assembly 34 for use by attending physicians. Batch mode images or selected real time images may be stored in a host database on disc storage 48 or on a cloud. When such images have been reconstructed and transferred to storage, the data processing server 24 notifies the data store server 26. The workstation 12 may be used by an operator to archive the images, produce films, or send the images via a network to other facilities.

Complex MR images may be reconstructed based on I and Q quadrature MR signals, using processes such as Fourier transform. Complex MR images $\hat{\rho}(x, y)$ as used herein are MR images with each pixel represented by a complex number, which has a real component $Re(\hat{\rho}(x, y))$ and an imaginary component $Im(\hat{\rho}(x, y))$, where $(x, y)$ is the location of the pixel in an image. Magnitude of a complex MR image, referred to as a magnitude image, is generated as $|\hat{\rho}(x, y)| = \sqrt{Re(\hat{\rho}(x,y))^2 + Im(\hat{\rho}(x,y))^2}$. A phase image, phase of a complex MR image, may also be generated and used, where phase $$\Phi(x, y) = \tan^{-1}\left(\frac{Im(\hat{\rho}(x, y))}{Re(\hat{\rho}(x, y))}\right).$$

A real image is an MR image with the value at each pixel as the real component $Re(\hat{\rho}(x, y))$. An imaginary image is an MR image with the value at each pixel as the imaginary component $Im(\hat{\rho}(x, y))$.

Compared to magnitude images, phase images are not often used because complex MR signals are often contaminated by undesired static and dynamic background phase variations caused by gradient imperfections, physiological noise such as cardiac and respiratory motion, and the object's intrinsic susceptibilities particularly exacerbated near interfaces between air and tissue. Phase images therefore are often discarded, and only magnitude images are used. The magnitude operation, however, changes the noise distribution from a central Gaussian distribution with zero expectation value to a non-central chi square noise distribution with a positive expectation value. As a result, the magnitude operation causes an overestimation of the signal and introduces significant bias in the derived quantitative maps, especially in signal to noise ratio (SNR)-starved applications. Further, the dynamic range of an image in low SNR applications is irreversibly reduced by the magnitude operation, reducing efficiency of improving SNR by averaging multiple magnitude images. Averaging in the complex domain is not always feasible because inconsistent background phase may lead to signal cancellation or destructive interference.

In addition, certain types of information can be encoded in the image phase. As discussed above, magnetic moments of nuclei precess about the magnetic field at the nuclei's Larmor frequency. The Larmor frequency depends on the nuclei, and the local magnetic field experienced by the nuclei. Phase information results from the time evolution of Larmor frequency shifts of the nuclei. Local magnetic field shifts could result from different chemical species, such as fat and water, or from local/non-local magnetic susceptibilities. Local magnetic field may be affected by motion in a bulk or microscopic level like diffusion, gradients, and susceptibilities. Phase images represent this frequency information of voxels in the object. Therefore, in applications for measuring parameters that are related to phase, such as phase contrast flow assessment and susceptibility quantification, phased images are preserved and used to fit signal models and derive maps. In these applications, the goodness of the fit hinges on the quality of phase estimates.

Accordingly, before processing, or correcting the phase information, robust and versatile phase estimation is needed. Known methods of phase correction include filter-based phase correction approaches or other spatial regularization techniques, such as least-squares fit of the phase to a low-order polynomial, and low-pass filtering of the complex signal or total variation. The methods cause feature loss due to spatial smoothing. Further, the known methods either require a prior knowledge of the phase information or a separately-acquired low-resolution phase image, the acquisition of which is time consuming and not always practical. More importantly, all of the known methods rely heavily on an assumption that the background phase is spatially smooth and the noise is stationary in the image space. These assumptions are often invalid due to contamination from physiological noise, motion encoding in the signal's phase, strong susceptibility gradients, or system imperfections. The known methods therefore may lead to erroneous signal loss in real value operation.

In contrast, the systems and methods disclosed herein use a deep neural network to denoise phase images, and circumvent the need of fine-tuning and selecting a filter for the specific conditions of an MR data acquisition, which may vary with the size of the object and the level of SNR. As used herein, denoising a phase image means reduction of the background phase and/or noise in the phase image. Moreover, the systems and methods disclosed herein provide robust and versatile phase estimation without making assumption about the background phase or the noise.

Figure 2A:
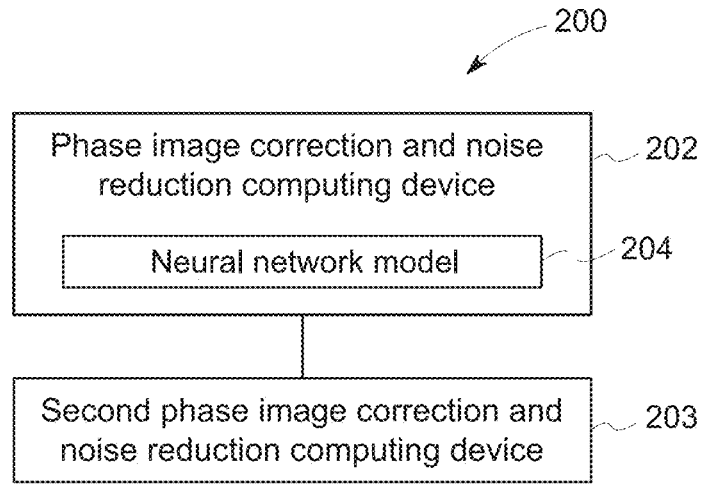
FIG. 2A is an exemplary phase image correction and noise reduction system.

FIG. 2A is a schematic diagram of an exemplary phase image correction and noise reduction system 200. In the exemplary embodiment, the system 200 includes a phase image correction and noise reduction computing device 202 configured to reduce noise in a phase image. The computing device 202 further includes a neural network model 204. The system 200 may include a second phase image correction and noise reduction computing device 203. The second phase image correction and noise reduction computing device 203 may be used to train the neural network model 204, and the phase image correction and noise reduction computing device 202 may then use the trained neural network model 204. The second phase image correction and noise reduction computing device 203 may be the same computing device as the phase image correction and noise reduction computing device 202 such that the training and use of the neural network model 204 are on one computing device. Alternatively, the second phase image correction and noise reduction computing device 203 may be a computing device separate from the phase image correction and noise reduction computing device 202 such that the training and use of the neural network model 204 are executed on separate computing devices. The phase image correction and noise reduction computing device 202 may be included in the workstation 12 of the MRI system 10, or may be included on a separate computing device that is in communication with the workstation 12.

Figure 2B:
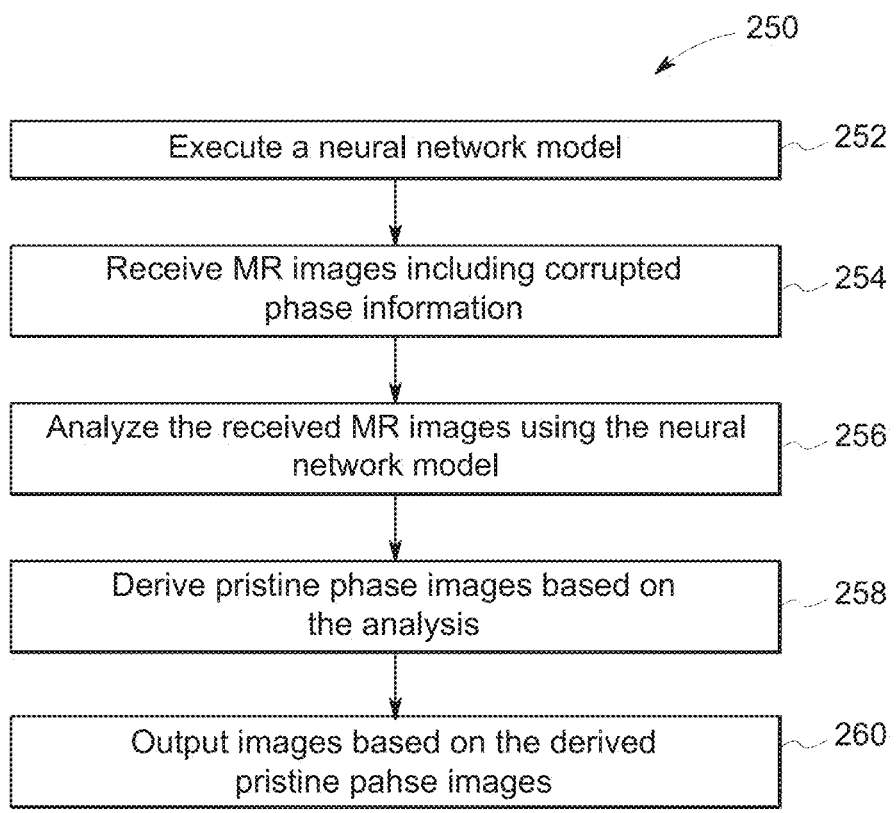
FIG. 2B is a flow chart of an exemplary method of reducing noise in phase images.

FIG. 2B is a flow chart of an exemplary method 250. The method 250 may be implemented on the phase image correction and noise reduction system 200. In the exemplary embodiment, the method includes executing 252 a neural network model for analyzing MR images. The neural network model is trained with training images. The training images may be a pair of pristine images and corrupted images, and the target output images of the neural network model are the pristine images. The corrupted images include corrupted phase information. The pristine images are the corrupted images with the corrupted phase information reduced. The training images include phase information, and are represented in any format that includes the phase information, such as complex MR images, phase images, real and imaginary pairs, or images in a phasor representation. In some embodiments, the corrupted images are simulated phase images contaminated with undesired phase artifacts, background phase and/or noise and the pristine images are the simulated phase images without contamination. The training images may be images contaminated with simulated noise from a highly heterogeneous data set, which may be from different applications, and/or acquired with different pulse sequences and/or different pulse sequence parameters.

The method 250 further includes receiving 254 MR images including corrupted phase information. The received MR images may be in any format that includes phase information, such as complex MR images, real and imaginary image pairs, or images in a phasor representation. Phase images may be generated based on the complex MR images by computing phase based on the real and imaginary components. The received MR images may be phase images. The phase images received or generated based on the received MR images are corrupted phase images. Corrupted phase images as used herein are phase images that include corrupted phase information. The method also includes analyzing 256 the received MR images using the neural network model. The received MR images may be directly inputted into the neural network, where the neural network model 204 may include one or more layer of neurons configured to generate phase images based on received images. In some embodiments, received MR images are processed and phase images are generated and input into the neural network model 204. The neural network model 204 outputs MR images with reduced corrupted phase information. The output images from the neural network model 204 include phase information, and may be in any format that includes phase information such as complex images, phase images, real and imaginary image pairs, or images in a phasor representation. In addition, the method 250 includes deriving 258 pristine phase images of the received MR images based on the analysis. In some embodiment, output phase images are computed based on the output images from the neural network model 204. In other embodiment, pristine phase images are directly output from the neural network model 204. Compared to the corrupted phase images of the received MR images, the derived pristine phase images include reduced corrupted phase information, i.e., with corrupted phase information reduced. The method 250 also includes outputting 260 images based on the pristine phase images.

The pristine phase images may be used to improve image quality. For example, denoised complex images may be generated by multiplying the original magnitude images with the pristine phase images. Denoised magnitude images may be generated based on the denoised complex images. The denoised complex images and/or the denoised magnitude images may be input into downstream imaging processing and data processing.

In some embodiments, the pristine phase images are used in diffusion-weighted imaging. For example, denoised complex images are derived by multiplying the original complex images with conjugate of the pristine phase images. The artifacts caused by the corrupted phase information in the denoised complex images are reduced or removed. Further, in diffusion-weighted imaging, the SNR can be low and background phase prevents effective averaging of multiple acquisitions (NEX). The pristine phase images can be used to further increase image quality by averaging the denoised complex images of multiple NEX to increase the SNR.

In one embodiment, pristine phase images are used in multi-shot diffusion weighted imaging, where k-space of an imaging slice is read out with multiple shots of RF excitation pulses. The MR signals from the multiple shots are combined and MR images are reconstruction based on the combined MR signals. The MR images are then input into the neural network model 204 and pristine phase-images are derived. Denoised complex images and/or magnitude images are generated using the pristine phase images and are then used to generate diffusion-weighted images of improved image quality.

In another embodiment, pristine phase images are used in imaging using a fast spin echo sequence such as PROPELLER (periodically rotated overlapping parallel lines with enhanced reconstruction), where k-space is sampled in a radial fashion. In PROPELLER, each "blade' may have slightly different phase corruption due to system imperfections such as eddy currents. Data or images acquired by PROPELLER sequence are received and a pristine phase image for each blade is derived. Denoised complex images and/or magnitude images are generated based on the pristine phase images to reduce corrupted phase information before combining blade images acquired with PROPELLER, thereby increasing image quality.

Diffusion weighted imaging and PROPELLER are used herein as examples only. The derived pristine phase images may be used to improve image quality of images acquired with overlapping acquisitions by providing phase images of reduced corrupted phase information before or after combining data acquired from the overlapping acquisitions. For example, the derived pristine phase images may be used in view sharing in cardiac Cine imaging, where the derive pristine phase images are used to improve the image quality of the images based on shared views from neighboring segments.

In some embodiments, pristine phase images are used in phase-sensitive inversion recovery (IR) imaging. In IR imaging, an IR RF pulse is applied, which is a 180° RF pulse and tips the magnetization to the −z axis. The IR RF pulse may also be referred to as IR preparation pulse. Magnetization then recovers by $T_1$ relaxation between the application of the IR pulse and the excitation RF pulse. IR imaging may be used to suppress fat or attenuate cerebral spinal fluid (CSF) by choosing the time between the IR pulse and the excitation RF pulse as the time when the magnetization from fat or CSF is close or equal to zero. IR imaging may also be used to increase tissue contrast as the dynamic range is doubled. However, contrast between positive and negative magnetization is lost in the magnitude images. Phase sensitive IR imaging use phase images to restore the phase difference among those voxels. Pristine phase images generated using the methods and system disclosed herein increases the accuracy of phase sensitive IR imaging by providing phase images with background phase and/or noise reduced.

In one embodiment, the pristine phase images are used in Dixon chemical shift imaging (CSI). In Dixon CSI, first images and second images are acquired. The first MR images are based on first MR signals that include a first echo of a first signal and a second signal, and the second MR images are based on second MR signals that include a second echo of the first signal and the second signal. The first echo has a first phase between the first signal and the second signal, the second echo has a second phase between the first signal and the second signal, and the first phase and the second phase are different from each other. In some embodiments, in-phase images and out-of-phase images are acquired. That is, the first phase is zero and the second phase is 180°. In in-phase images, MR signals from water and fat are in phase or of an in-phase echo of the fat signal and the water signal. In out-of-phase images, MR signals from water and fat are out of phase or of an opposed phase echo of the fat signal and the water signal. Fat-only or water-only images are then generated based on the summation and subtraction of the in-phase and out-of-phase images. However, due to local susceptibility effects, the accuracy of the generated fat-only or water-only images suffers. The pristine phase images are used to correct the local susceptibility effects and correct the fat-only and water-only images.

In some embodiments, the pristine phase images are used in generating phase sensitive maps, such as MR flow assessment, MR susceptibility imaging, tissue mechanical property maps in MR elastography, and temperature maps in MR thermometry which may be used in MR guided focused ultrasound (MRgFUS). In MR flow assessment, because phase shift is proportional to velocity when bipolar encoding gradients are applied, phase information contained in phase images is used to measure flow. The pristine phased images increase the accuracy of the flow assessment by providing phase images of reduced background phase and/or noise. In MR elastography, shear waves are introduced into the body and mechanical properties of the tissue in response to compression or vibration introduced by the shear waves are measured, using phase sensitive MR sequence. Like in MR flow assessment, phase shift is accumulated in moving tissues and is not accumulated in stationary tissues. Phase images therefore are used to measure displacements and to reconstruct mechanical properties of the tissues. Similarly, the accuracy of the measurements is increased by using pristine phase images.

In MR susceptibility imaging, quantitative susceptibility maps are generated based at least in part on phase images. Similarly, improved phase images of pristine phased images are used to improve the generated susceptibility maps.

In MR thermometry, because temperature changes result in changes in resonance frequencies of nuclei, phase shifts from heating are used to measure the temperatures or temperature changes in tissues. Again, pristine phase images are used to improve the measured temperature or temperature changes by providing phase images having reduced noise and/or background phase. The generated temperature maps may be used to guide focused ultrasound treatments in MRgFUS.

In sum, pristine phase images by deep learning denoising (DL denoising) can be used to increase accuracy of measurements or quantification of parameters that are sensitive to phase changes by using phase sensitive MR imaging. Pristine phase images can also be used to improve image quality in applications where inaccurate phase estimation affects the image quality and assessment.

In some embodiments, the systems and methods are applied to multi-channel and/or multi-coil systems. For example, phase images of each channel or each coil are denoised using DL denoising, and the pristine phase images are used to improve image quality of the images and/or increase accuracy of measurements or quantification. The pristine phase images may be used before or after combining data from multi-channels or multi-coils.

Figure 3:
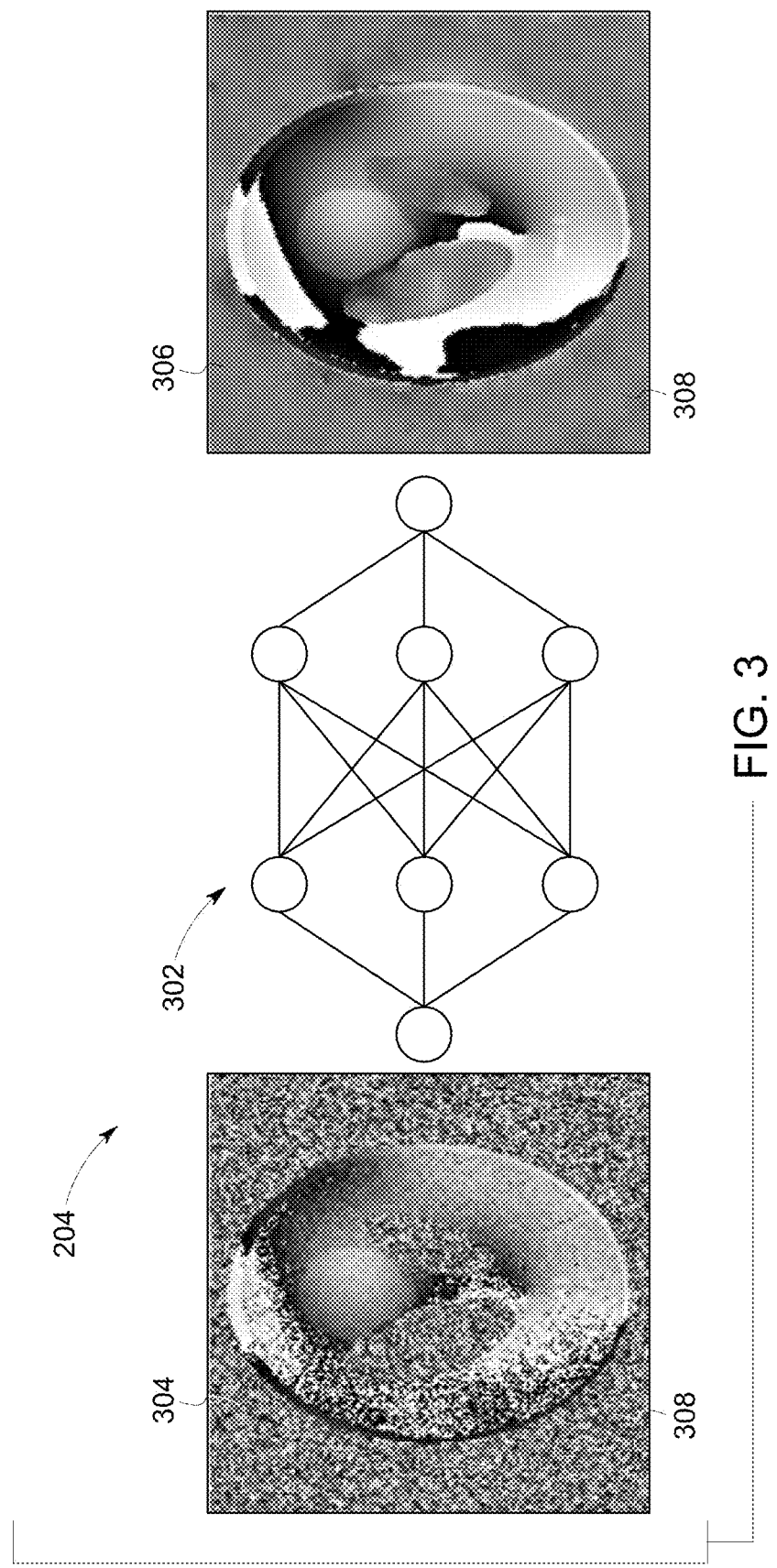
FIG. 3 is an exemplary neural network model for the system shown in FIG. 2A.

FIG. 3 is a schematic diagram of an exemplary neural network model 204. The neural network model 204 may include a convolutional neural network 302. The neural network 302 accepts a MR phase image 304 contaminated with corrupted phase information and returns a pristine phase image 306, where the background phase 308 has been substantially denoised. Inputs and outputs to the neural network 302 may also be complex images, magnitude and phase image pairs, or real or imaginary image pairs. The neural network 302 may trained with a loss function, which is a function measuring the inference error by the neural network 302. The loss function may be expressed as min (f1(input)−f2(output)), where f1 and f2 are functions of the input and the output to the neural network 302, respectively. In some embodiment, the loss function includes constraints based on prior knowledge of the phase information. For example, prior knowledge is that phase aliasing or phase wrapping may be caused by the computation method of phases. The phase calculated based on the equation of phase $$\Phi(x, y) = \tan^{-1}\left(\frac{Im(\hat{\rho}(x, y))}{Re(\hat{\rho}(x, y))}\right)$$

is limited to the range of $[-\pi, \pi]$. However, in real life, phases may be any real values. As a result, phases with addition of multiple $2\pi$'s appear as same phase values, causing phase aliasing. In phase sensitive imaging applications, where phase is used to encode a physical phenomenon, such as flow, motion, or temperature, prior knowledge includes physical law. Phase that behaves against physical law is penalized by the loss function. For example, in flow imaging or quantitative susceptibility measurements (QSM), flow is divergence free. In thermal imaging, heat is expected to dissipate relatively uniformly. For displacement imaging such as elastography, the displacement is expected to obey physical law of motion.

Figure 4A:
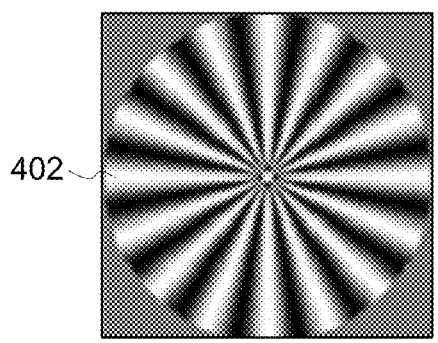
FIG. 4A is a phase image of a phantom without noise.
Figure 4B:
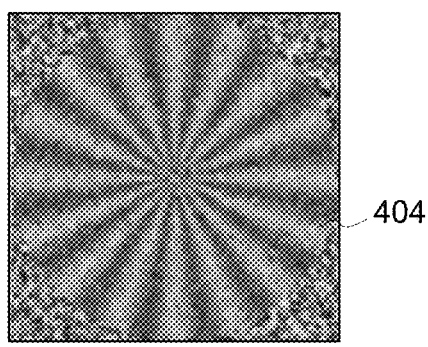
FIG. 4B is the phase image shown in FIG. 4A contaminated with noise.
Figure 4E:
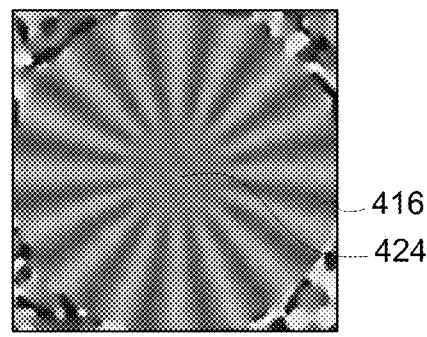
FIG. 4E is a pristine phase image of the phase image shown in FIG. 4B using low-pass filtering.
Figure 4C:
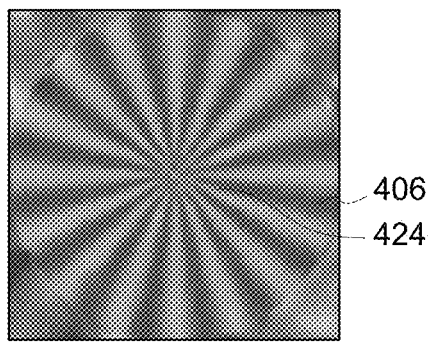
FIG. 4C is a pristine phase image of the phase image shown in FIG. 4B using deep-learning denoising.
Figure 4F:
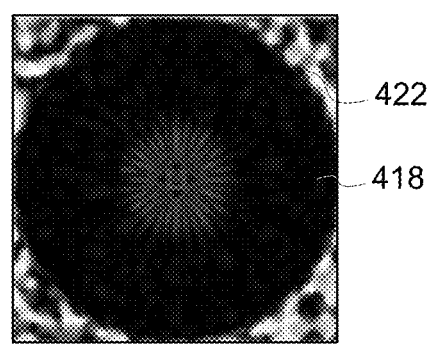
FIG. 4F is a phase error image of the pristine phase image shown in FIG. 4F.
Figure 4D:
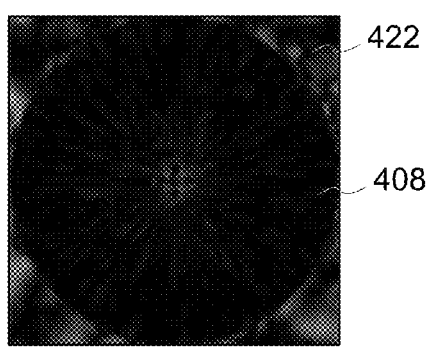
FIG. 4D is a phase error image of the pristine phase image shown in FIG. 4C.

FIGS. 4A-4F provide a comparison of phase correction using DL denoising with denoising by filtering for a radial phase phantom. FIG. 4A is a phase image 402 having a radial pattern. The phase image 402 corresponds to imaging sequence of PROPELLER. FIG. 4B is a phase image 404 of the phase image 402 contaminated with corrupted phase information. FIGS. 4C-4D are a pristine phase image 406, and phase errors 408 between the pristine phase image 406 and the true phase image 402, using the deep learning or neural network-based systems and methods as disclosed herein. FIGS. 4E-4F are respectively, a pristine phase image 416, and phase errors 418 between the pristine phase image 416 and the true phase image 402. Comparing the pristine phase image 406 and 416, neural network-based denoising demonstrates better high spatial-frequency response and lower phase error in the low-SNR background region 422 of the phantom, than low-pass filtering. The high spatial-frequency phase information 424 is lost or smoothed out by the filtering.

Figure 5A:
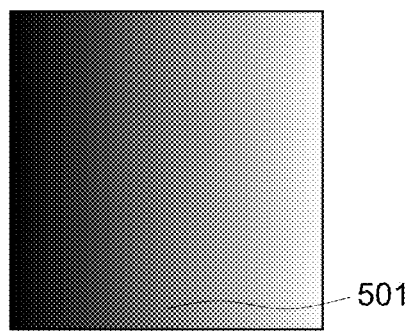
FIG. 5A is a magnitude image of another phantom.
Figure 5B:
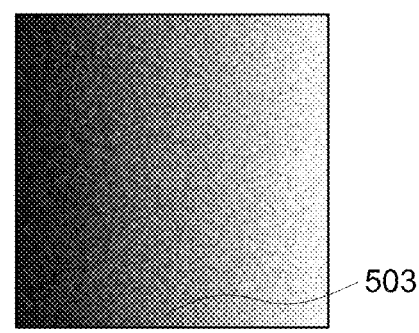
FIG. 5B is a magnitude image of the phantom of FIG. 5A contaminated with noise.
Figure 5C:
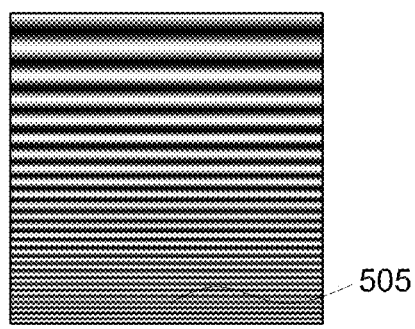
FIG. 5C is a phase image of the phantom of FIG. 5A.
Figure 5D:
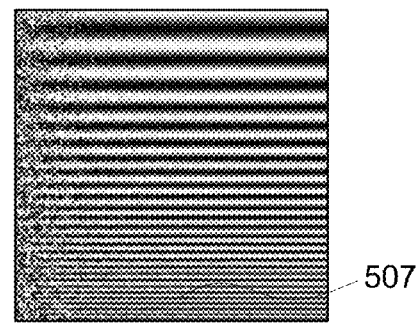
FIG. 5D is a phase image of the phantom of FIG. 5B.
Figure 5E:
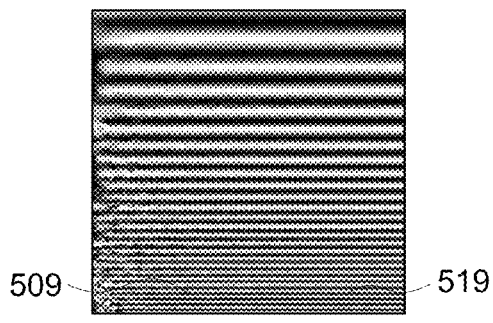
FIG. 5E is a pristine phase image of the phantom of FIG. 5B using deep learning denoising.
Figure 5F:
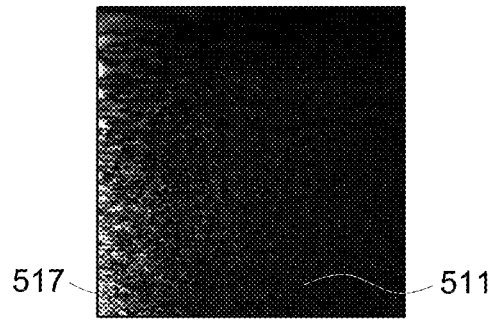
FIG. 5F is an image of the difference between the deep learning denoised result of FIG. 5E and the true phase of FIG. 5A.
Figure 5G:
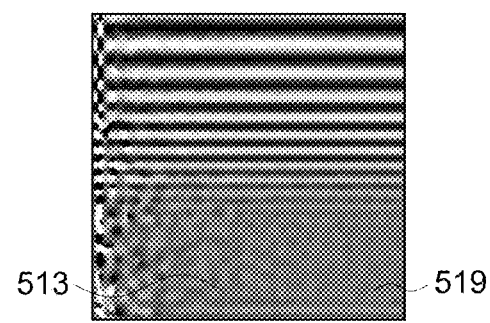
FIG. 5G is a pristine phase image of the phantom of FIG. 5B using low-pass filtering.
Figure 5H:
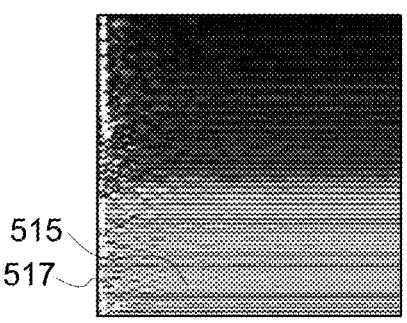
FIG. 5H is an image of the difference between the low-pass filtered result of FIG. 5G and the true phase of FIG. 5A.

FIGS. 5A-5H show simulation results of phase contrast detail phantom. FIG. 5A is a magnitude image 501 of the phantom without contamination. FIG. 5B is a noisy magnitude image 503 of the phantom. FIG. 5C is the phase image 505 of the phantom without contamination. FIG. 5D is a corrupted phase image 507 of the phantom. As shown in FIGS. 5A and 5C, pixel SNR of the phantom increases from left to right (FIG. 5A), and spatial frequency of the phase increases from top to bottom (FIG. 5C). FIGS. 5E and 5F are a pristine phase image 509 and a phase error image 511 of the phantom, using DL denoising. FIGS. 5G and 5H are a pristine phase image 513 and a phase error image 515 of the phantom, using low-pass filtering. Again, the DL-denoising demonstrates better performance in regions 517 of the phantom with lower SNR and regions 519 of the phantom with higher spatial frequency phase content.

Figure 6A:
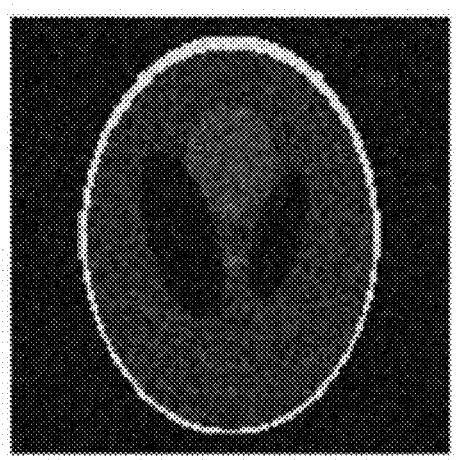
FIG. 6A is a magnitude image of the phantom.
Figure 6B:
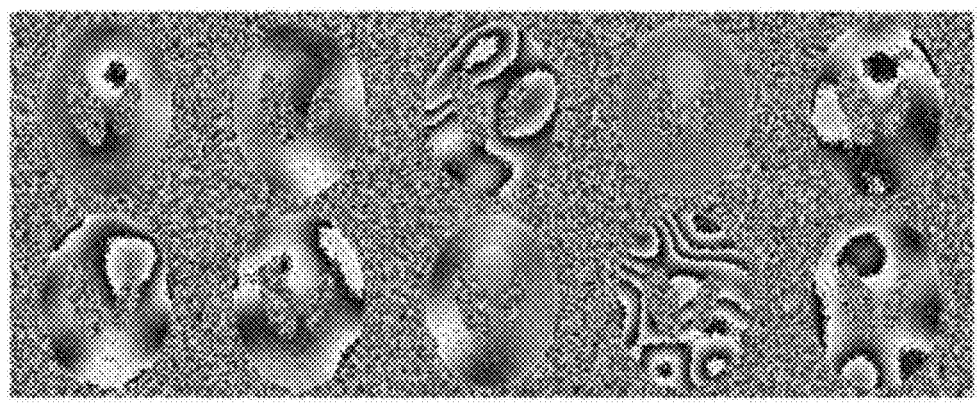
FIG. 6B are phase images of the phantom of FIG. 6A with the number of acquisitions (NEX) as ten.
Figure 6C:
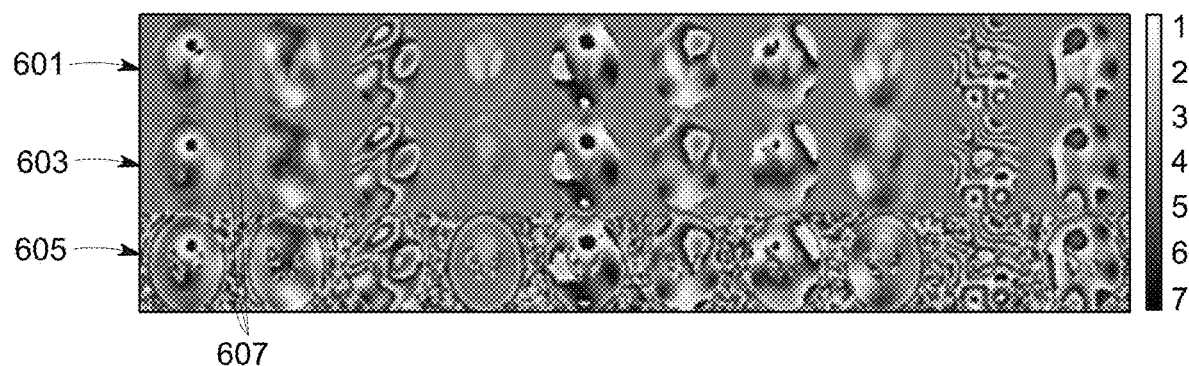
FIG. 6C are true phase images, pristine phase images using deep learning denoising, and pristine phase images using low-pass filtering of the ten acquisitions.
Figure 6D:
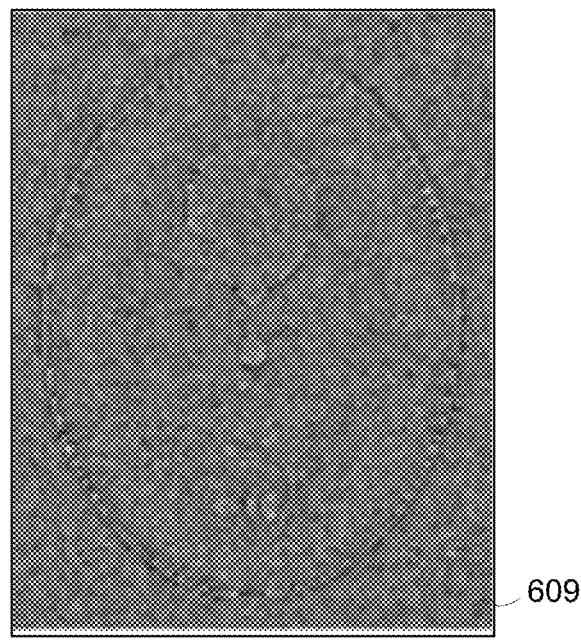
FIG. 6D is an imaginary image of the phantom of FIG. 6A after phase correcting the original with the deep learning denoising result.
Figure 6E:
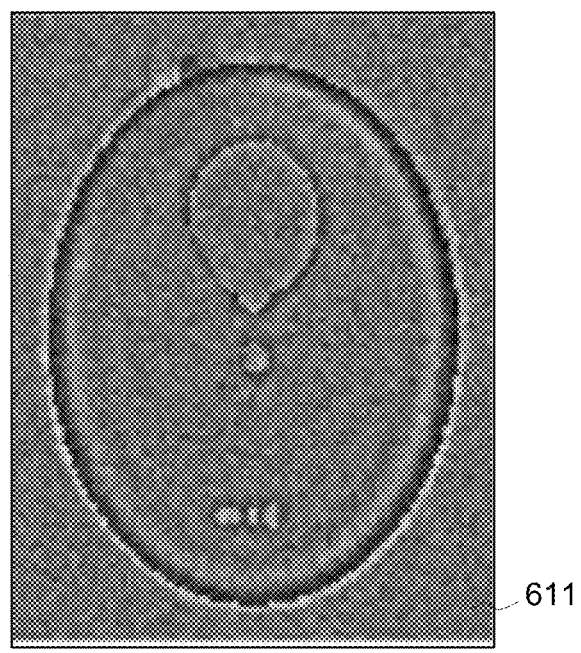
FIG. 6E is an imaginary image of the phantom of FIG. 6A after phase correcting the original with the low-pass filtering result.

FIGS. 6A-6E show simulation results of a phantom with a multiple repetitions, where the background phase randomly fluctuates between repetitions, for example, in diffusion-weighted imaging using echo planar imaging (WI-EPI). Ten repetitions or 10 NEX are used herein as an example. FIG. 6A is a noisy magnitude image with one acquisition. FIG. 6B shows corrupted phase images for the repetitions. FIG. 6C compares the ground truth phase images 601 (the top row), pristine phase images 603 using DL denoising (the middle row), and pristine phase images 605 using low-pass filtering (the bottom row). FIGS. 6D and 6E show the imaginary image 609 after denoising using DL denoising (FIG. 6D) and the imaginary image 611 after low-pass filtering (FIG. 6E). As shown in FIG. 6C, DL denoising has superior performance to denoising with low-pass filtering, where pristine phase images 603 by DL denoising are much closer to the ground truth phase images 601 than the pristine phase images 605 by low-pass filter, especially in the background region 607. These accurate phase images 603 are also reflected by the noise-like imaginary image 609 after phase-correcting the originals with the DL denoising results and averaging the complex results.

Figure 7A:
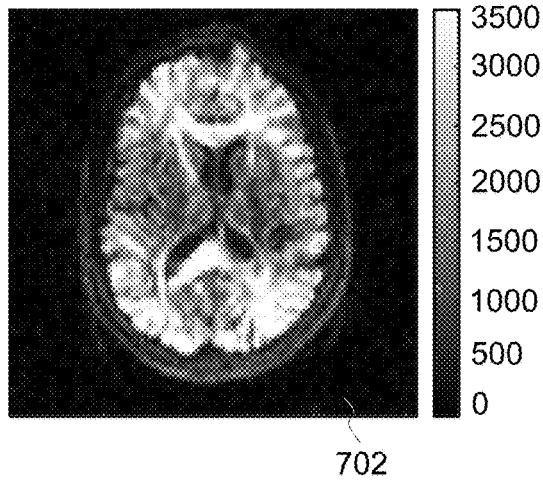
FIG. 7A is a real image of a diffusion-weighted image applied with deep learning denoising.
Figure 7D:
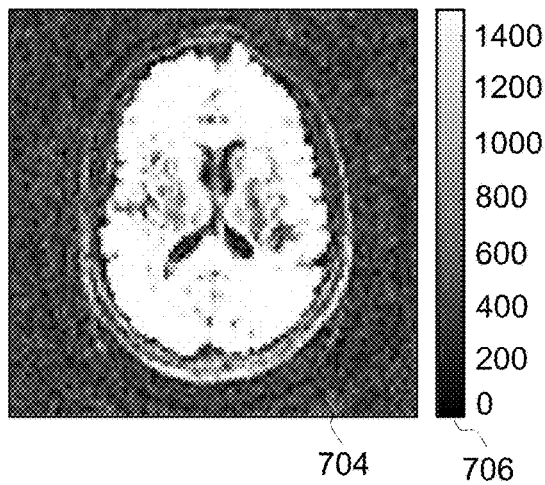
FIG. 7D is the real image shown in FIG. 7B displayed with a reduced window level.
Figure 7B:
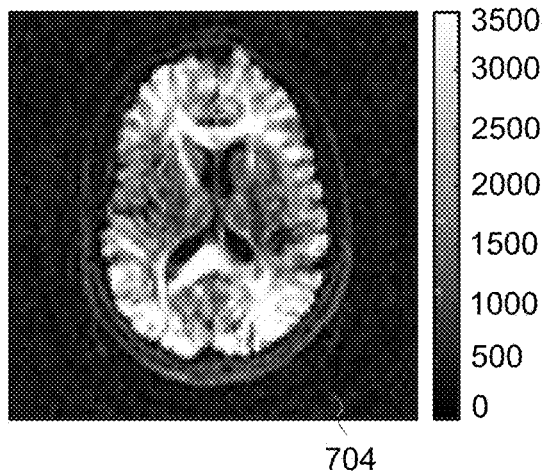
FIG. 7B is a real image of the diffusion-weighted image of FIG. 7A applied with low-pass filtering.
Figure 7E:
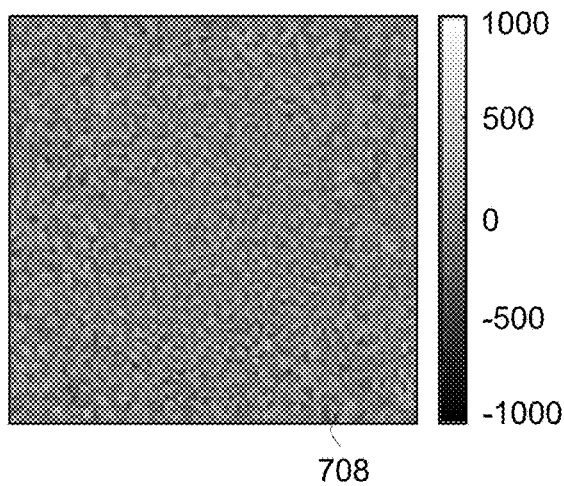
FIG. 7E is an imaginary image of the diffusion-weighted image after phase correcting the original with the deep learning denoising result.
Figure 7C:
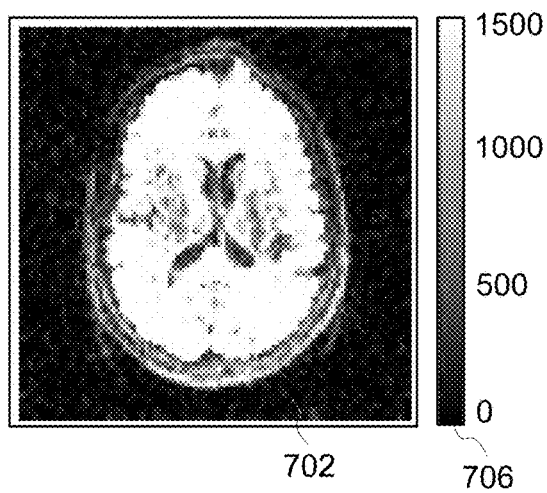
FIG. 7C is the real image shown in FIG. 7A displayed with a reduced window level.
Figure 7F:
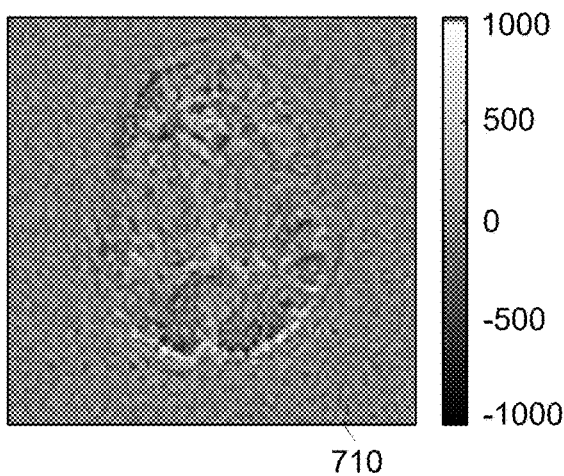
FIG. 7F is an imaginary image of the diffusion-weighted image after phase correcting the original with the low-pass filtering result.

FIGS. 7A-7F show brain diffusion weighted images acquired at b=300 s/mm$^2$ with NEX of 10. FIG. 7A is a real image 702 with DL denoising, FIG. 7B is a real image 704 with low pass filtering. FIGS. 7C and 7D are the real images 702, 704 shown in FIGS. 7A and 7B displayed with a reduced window level 706 to shown the background signal. FIGS. 7E and 7F show the imaginary images 708, 710 after denoising with DL denoising (FIG. 7E) or low-pass filtering (FIG. 7F). Darker background is observed in the real image 702, demonstrating a better phase correction in low SNR regions with a DL denoising than with low-pass filtering. Further, minimal signal in the imaginary image 708 shows a better phase correction overall using a DL denoising than with low-pass filtering.

Figure 8A:
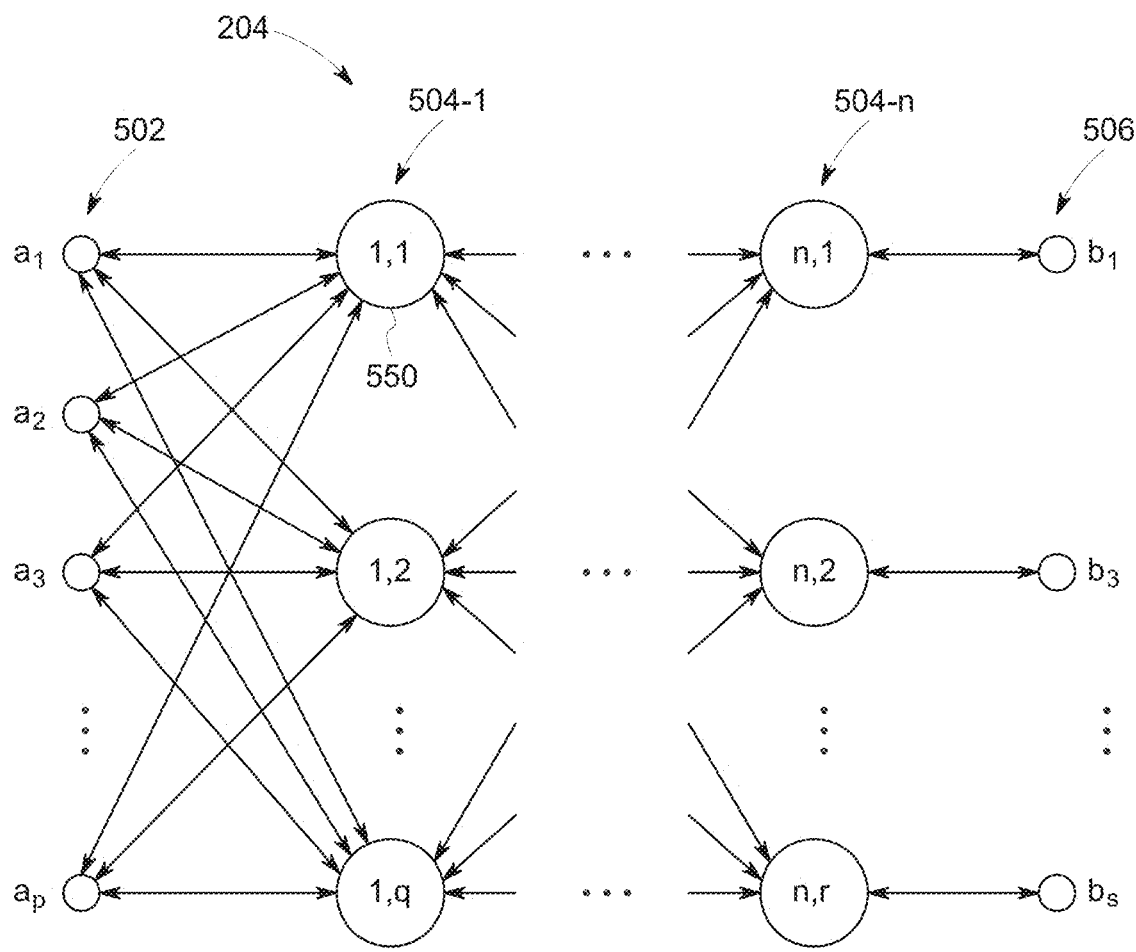
FIG. 8A is a schematic diagram of a neural network model.

FIG. 8A depicts an exemplary artificial neural network model 204. The exemplary neural network model 204 includes layers of neurons 502, 504-1 to 504-$n$, and 506, including an input layer 502, one or more hidden layers 504-1 through 504-$n$, and an output layer 506. Each layer may include any number of neurons, i.e., q, r, and n in FIG. 8A may be any positive integers. It should be understood that neural networks of a different structure and configuration from that depicted in FIG. 8A may be used to achieve the methods and systems described herein.

In the exemplary embodiment, the input layer 502 may receive different input data. For example, the input layer 502 includes a first input $a_1$ representing training images, a second input $a_2$ representing patterns identified in the training images, a third input $a_3$ representing edges of the training images, and so on. The input layer 502 may include thousands or more inputs. In some embodiments, the number of elements used by the neural network model 204 changes during the training process, and some neurons are bypassed or ignored if, for example, during execution of the neural network, they are determined to be of less relevance.

In the exemplary embodiment, each neuron in hidden layer(s) 504-1 through 504-$n$ processes one or more inputs from the input layer 502, and/or one or more outputs from neurons in one of the previous hidden layers, to generate a decision or output. The output layer 506 includes one or more outputs each indicating a label, confidence factor, weight describing the inputs, and/or an output image. In some embodiments, however, outputs of the neural network model 204 are obtained from a hidden layer 504-1 through 504-$n$ in addition to, or in place of, output(s) from the output layer(s) 506.

In some embodiments, each layer has a discrete, recognizable function with respect to input data. For example, if n is equal to 3, a first layer analyzes the first dimension of the inputs, a second layer the second dimension, and the final layer the third dimension of the inputs. Dimensions may correspond to aspects considered strongly determinative, then those considered of intermediate importance, and finally those of less relevance.

In other embodiments, the layers are not clearly delineated in terms of the functionality they perform. For example, two or more of hidden layers 504-1 through 504-$n$ may share decisions relating to labeling, with no single layer making an independent decision as to labeling.

Figure 8B:
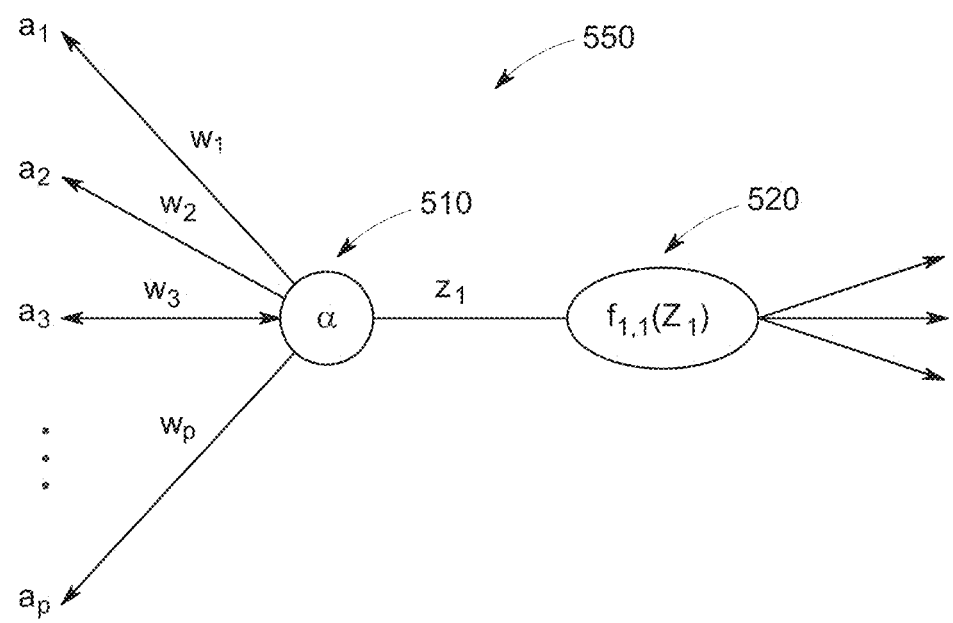
FIG. 8B is a schematic diagram of a neuron in the neural network model shown in FIG. 8A.

FIG. 8B depicts an example neuron 550 that corresponds to the neuron labeled as "1,1" in hidden layer 504-1 of FIG. 8A, according to one embodiment. Each of the inputs to the neuron 550 (e.g., the inputs in the input layer 502 in FIG. 8A) is weighted such that input $a_1$ through $a_p$ corresponds to weights $w_1$ through $w_p$ as determined during the training process of the neural network model 204.

In some embodiments, some inputs lack an explicit weight, or have a weight below a threshold. The weights are applied to a function a (labeled by a reference numeral 510), which may be a summation and may produce a value $z_1$ which is input to a function 520, labeled as $f_{1,1}(z_1)$. The function 520 is any suitable linear or non-linear function. As depicted in FIG. 5B, the function 520 produces multiple outputs, which may be provided to neuron(s) of a subsequent layer, or used as an output of the neural network model 204. For example, the outputs may correspond to index values of a list of labels, or may be calculated values used as inputs to subsequent functions.

It should be appreciated that the structure and function of the neural network model 204 and the neuron 550 depicted are for illustration purposes only, and that other suitable configurations exist. For example, the output of any given neuron may depend not only on values determined by past neurons, but also on future neurons.

The neural network model 204 may include a convolutional neural network (CNN), a deep learning neural network, a reinforced or reinforcement learning module or program, or a combined learning module or program that learns in two or more fields or areas of interest. Supervised and unsupervised machine learning techniques may be used. In supervised machine learning, a processing element may be provided with example inputs and their associated outputs, and may seek to discover a general rule that maps inputs to outputs, so that when subsequent novel inputs are provided the processing element may, based upon the discovered rule, accurately predict the correct output. The neural network model 204 may be trained using unsupervised machine learning programs. In unsupervised machine learning, the processing element may be required to find its own structure in unlabeled example inputs. Machine learning may involve identifying and recognizing patterns in existing data in order to facilitate making predictions for subsequent data. Models may be created based upon example inputs in order to make valid and reliable predictions for novel inputs.

Additionally or alternatively, the machine learning programs may be trained by inputting sample data sets or certain data into the programs, such as images, object statistics, and information. The machine learning programs may use deep learning algorithms that may be primarily focused on pattern recognition, and may be trained after processing multiple examples. The machine learning programs may include Bayesian Program Learning (BPL), voice recognition and synthesis, image or object recognition, optical character recognition, and/or natural language processing—either individually or in combination. The machine learning programs may also include natural language processing, semantic analysis, automatic reasoning, and/or machine learning.

Based upon these analyses, the neural network model 204 may learn how to identify characteristics and patterns that may then be applied to analyzing image data, model data, and/or other data. For example, the model 204 may learn to identify features in a series of data points.

Figure 9:
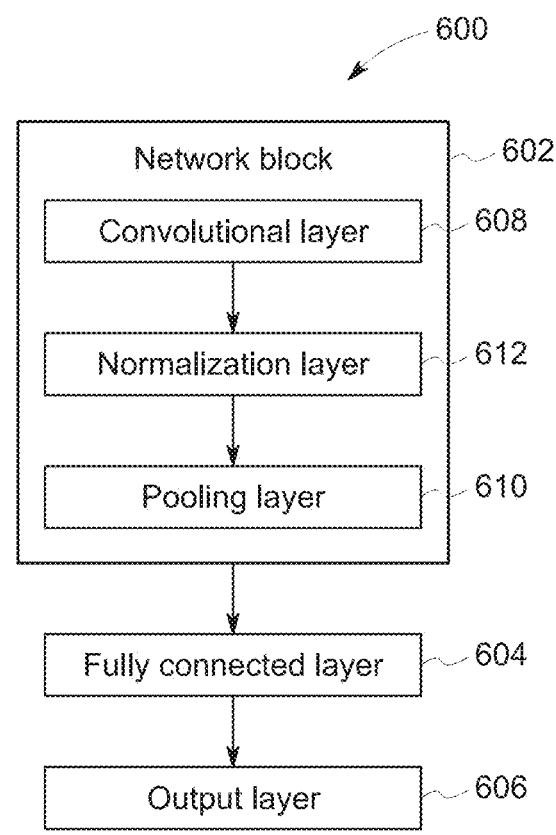
FIG. 9 is a schematic diagram of an exemplary convolutional neural network.

FIG. 9 is a block diagram of an exemplary CNN 600 that may be included in the neural network model 204. The CNN 600 includes a convolutional layer 608. In a convolutional layer, convolution is used in place of general matrix multiplication in a neural network model. In one example, a 1×1 convolution is used to reduce the number of channels in the neural network 600. The neural network 600 includes one or more convolutional layer blocks 602, a fully-connected layer 604 where the neurons in this layer is connected with every neuron in the prior layer, and an output layer 606 that provides outputs.

In the exemplary embodiment, the convolutional layer block 602 includes a convolutional layer 608 and a pooling layer 610. Each convolutional layer 608 is flexible in terms of its depth such as the number of convolutional filters and sizes of convolutional filters. The pooling layer 610 is used to streamline the underlying computation and reduce the dimensions of the data by combining outputs of neuron clusters at the prior layer into a single neuron in the pooling layer 610. The convolutional layer block 602 may further include a normalization layer 612 between the convolutional layer 608 and the pooling layer 610. The normalization layer 612 is used to normalize the distribution within a batch of training images and update the weights in the layer after the normalization. The number of convolutional layer blocks 602 in the neural network 600 may depend on the image quality of training images, and levels of details in extracted features.

In operation, in training, training images and other data such as extracted features of the training images are inputted into one or more convolutional layer blocks 602. Observed masks corresponding to the training images are provided as outputs of the output layer 606. Neural network 600 is adjusted during the training. Once the neural network 600 is trained, an input image is provided to the one or more convolutional layer blocks 602 and the output layer 606 provides outputs that include a mask associated with the input image.

Figure 10:
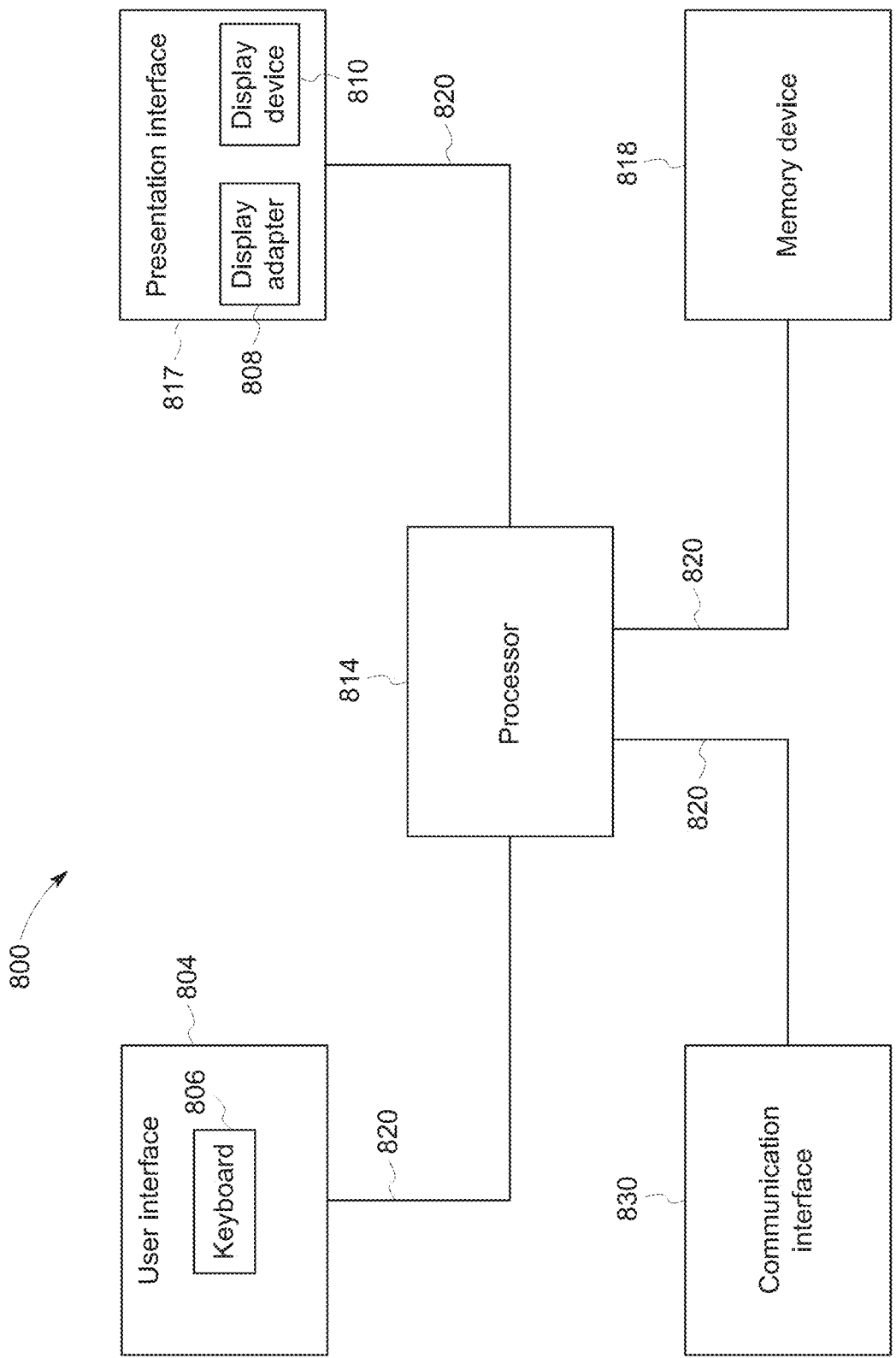
FIG. 10 is a block diagram of an exemplary computing device.

The workstation 12 and the phase image correction and noise reduction computing device 202, 203 described herein may be any suitable computing device 800 and software implemented therein. FIG. 10 is a block diagram of an exemplary computing device 800. In the exemplary embodiment, the computing device 800 includes a user interface 804 that receives at least one input from a user. The user interface 804 may include a keyboard 806 that enables the user to input pertinent information. The user interface 804 may also include, for example, a pointing device, a mouse, a stylus, a touch sensitive panel (e.g., a touch pad and a touch screen), a gyroscope, an accelerometer, a position detector, and/or an audio input interface (e.g., including a microphone).

Moreover, in the exemplary embodiment, computing device 800 includes a display interface 817 that presents information, such as input events and/or validation results, to the user. The display interface 817 may also include a display adapter 808 that is coupled to at least one display device 810. More specifically, in the exemplary embodiment, the display device 810 may be a visual display device, such as a cathode ray tube (CRT), a liquid crystal display (LCD), a light-emitting diode (LED) display, and/or an "electronic ink" display. Alternatively, the display interface 817 may include an audio output device (e.g., an audio adapter and/or a speaker) and/or a printer.

The computing device 800 also includes a processor 814 and a memory device 818. The processor 814 is coupled to the user interface 804, the display interface 817, and the memory device 818 via a system bus 820. In the exemplary embodiment, the processor 814 communicates with the user, such as by prompting the user via the display interface 817 and/or by receiving user inputs via the user interface 804. The term "processor" refers generally to any programmable system including systems and microcontrollers, reduced instruction set computers (RISC), complex instruction set computers (CISC), application specific integrated circuits (ASIC), programmable logic circuits (PLC), and any other circuit or processor capable of executing the functions described herein. The above examples are exemplary only, and thus are not intended to limit in any way the definition and/or meaning of the term "processor."

In the exemplary embodiment, the memory device 818 includes one or more devices that enable information, such as executable instructions and/or other data, to be stored and retrieved. Moreover, the memory device 818 includes one or more computer readable media, such as, without limitation, dynamic random access memory (DRAM), static random access memory (SRAM), a solid state disk, and/or a hard disk. In the exemplary embodiment, the memory device 818 stores, without limitation, application source code, application object code, configuration data, additional input events, application states, assertion statements, validation results, and/or any other type of data. The computing device 800, in the exemplary embodiment, may also include a communication interface 830 that is coupled to the processor 814 via the system bus 820. Moreover, the communication interface 830 is communicatively coupled to data acquisition devices.

In the exemplary embodiment, the processor 814 may be programmed by encoding an operation using one or more executable instructions and providing the executable instructions in the memory device 818. In the exemplary embodiment, the processor 814 is programmed to select a plurality of measurements that are received from data acquisition devices.

In operation, a computer executes computer-executable instructions embodied in one or more computer-executable components stored on one or more computer-readable media to implement aspects of the invention described and/or illustrated herein. The order of execution or performance of the operations in embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

At least one technical effect of the systems and methods described herein includes (a) reduction of corrupted phase information in phase images; (b) generation of robust phase images; and (c) versatile generation of phase images without assumption about phase and noise.

Exemplary embodiments of systems and methods of phase correction and noise reduction in phase images are described above in detail. The systems and methods are not limited to the specific embodiments described herein but, rather, components of the systems and/or operations of the methods may be utilized independently and separately from other components and/or operations described herein. Further, the described components and/or operations may also be defined in, or used in combination with, other systems, methods, and/or devices, and are not limited to practice with only the systems described herein.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A computer-implemented method of correcting phase and reducing noise in magnetic resonance (MR) phase images, comprising:
   executing a neural network model for analyzing MR images, wherein the neural network model is trained with a pair of pristine images and corrupted images, wherein the corrupted images include corrupted phase information, the pristine images are the corrupted images with the corrupted phase information reduced, and target output images of the neural network model are the pristine images; receiving MR images including corrupted phase information;
   analyzing the received MR images using the neural network model;
   deriving pristine phase images of the received MR images based on the analysis, wherein the derived pristine phase images include reduced corrupted phase information, compared to the received MR images; and
   generating improved MR images based on the reduced corrupted phase information derived from the pristine phase images.

2. The method of claim 1, wherein the corrupted phase information includes noise in phase images, and the derived pristine phase images include reduced noise in phase images, compared to the received MR images.

3. The method of claim 1, wherein the neural network model is trained with a loss function including a constraint based on prior knowledge of phase information.

4. The method of claim 1, further comprising:
   generating a phase sensitive map based at least in part on the pristine phase images.

5. The method of claim 4, wherein generating a phase sensitive map further comprises:
   generating a quantitative susceptibility map based at least in part on the pristine phase images.

6. The method of claim 4, wherein generating a phase sensitive map further comprises:
   deriving a flow velocity based on the pristine phase images.

7. The method of claim 4, wherein generating a phase sensitive map further comprises:
   generating a map of a tissue mechanical property based at least in part on the pristine phase images.

8. The method of claim 4, wherein generating a phase sensitive map further comprises:
   generating a temperature map based at least in part on the pristine phase images.

9. The method of claim 1, wherein:
   receiving MR images further comprises receiving first MR images and second MR images, wherein the first MR images are based on first MR signals that include a first echo of a first signal and a second signal, and the second MR images are based on second MR signals that include a second echo of the first signal and the second signal, the first echo has a first phase between the first signal and the second signal, the second echo has a second phase between the first signal and the second signal, and the first phase and the second phase are different from each other;
   deriving pristine phase images further comprises deriving first pristine phase images of the first MR images and second pristine phase images of the second MR images using the neural network model; and
   the method further comprises generating images of the first signal only and images of the second signal only based at least in part on the first pristine phase images and the second pristine phase images.

10. The method of claim 9, wherein the first echo is an in-phase echo of the first signal and the second signal, and the second echo is an opposed-phase echo of the first signal and the second signal.

11. The method of claim 9, wherein the first signal comprises a water signal, and the second signal comprises a fat signal.

12. The method of claim 1, wherein the received MR images comprises images acquired with overlapping acquisitions.

13. The method of claim 12, wherein the received MR images comprise images acquired with a plurality of acquisitions.

14. The method of claim 1, wherein the received MR images are diffusion weighted images.

15. The method of claim 1, wherein the received MR images comprises images acquired with a plurality of shots.

16. The method of claim 1, wherein the received MR images comprises images acquired with an inversion-recovery preparation pulse.

17. A phase image correction and noise reduction system, comprising a phase image correction and noise reduction computing device, the phase image correction and noise reduction computing device comprising at least one processor in communication with at least one memory device, and the at least one processor programmed to:
 execute a neural network model for analyzing MR images, wherein the neural network model is trained with a pair of pristine images and corrupted images, wherein the corrupted images include corrupted phase information, the pristine images are the corrupted images with the corrupted phase information reduced, and target output images of the neural network model are the pristine images;
 receive MR images including corrupted phase information;
 analyze the received MR images using the neural network model;
 derive pristine phase images of the received MR images based on the analysis, wherein the pristine phase images include reduced corrupted phase information, compared to the received MR images; and
 generate improved MR images based on the reduced corrupted phase information derived from the pristine phase images.

18. The system of claim 17, the at least one processor further programmed to:
 generate a phase sensitive map based at least in part on the pristine phase images.

19. The system of claim 17, the at least one processor further programmed to:
 receive first MR images and second MR images, wherein the first MR images are based on first MR signals that include a first echo of a first signal and a second signal, and the second MR images are based on second MR signals that include a second echo of the first signal and the second signal, wherein the first echo includes a first phase between the first signal and the second signal, the second echo include a second phase between the first signal and the second signal, and the first phase and the second phase are different from each other;
 derive first pristine phase images of the first MR images and second pristine phase images of the second MR images using the neural network model; and
 generate images of the first signal only and images of the second signal only based at least in part on the first pristine phase images and the second pristine phase images.

20. The system of claim 19, wherein the first echo is an in-phase echo of the first signal and the second signal, the second echo is an opposed-phase echo of the first signal and the second signal, the first signal comprises a water signal, and the second signal comprises a fat signal.

\* \* \* \* \*